United States Patent
Loopstra et al.

(10) Patent No.: US 7,110,083 B2
(45) Date of Patent: Sep. 19, 2006

(54) LITHOGRAPHIC APPARATUS AND DEVICE MANUFACTURING METHOD

(75) Inventors: Erik Roelof Loopstra, Heeze (NL); Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/715,828

(22) Filed: Nov. 19, 2003

(65) Prior Publication Data

US 2005/0105069 A1 May 19, 2005

(51) Int. Cl.
*G03B 27/42* (2006.01)
*G01B 11/00* (2006.01)

(52) U.S. Cl. .......................... 355/53; 356/399
(58) Field of Classification Search ............ 355/52, 355/53, 55, 67; 250/548; 356/399–401
See application file for complete search history.

(56) References Cited

U.S. PATENT DOCUMENTS

| | | | |
|---|---|---|---|
| 5,187,519 A | | 2/1993 | Takabayashi et al. |
| 6,327,026 B1 * | | 12/2001 | Wakui ........................ 355/72 |
| 6,359,688 B1 * | | 3/2002 | Akimoto et al. ............ 356/401 |
| 6,420,716 B1 | | 7/2002 | Cox et al. |
| 6,490,025 B1 * | | 12/2002 | Makinouchi et al. ......... 355/53 |
| 6,522,388 B1 * | | 2/2003 | Takahashi et al. ............ 355/53 |
| 6,912,041 B1 * | | 6/2005 | Butler et al. .................. 355/53 |
| 2002/0149754 A1 | | 10/2002 | Auer et al. |
| 2003/0053035 A1 | | 3/2003 | Butler et al. |
| 2004/0065847 A1 | | 4/2004 | Franken et al. |

FOREIGN PATENT DOCUMENTS

| | | | |
|---|---|---|---|
| EP | 1137054 A1 * | 9/2001 |
| EP | 1 265 104 A1 | 12/2002 |
| EP | 1 321 822 A1 | 6/2003 |
| JP | 411-87233 * | 3/1999 |

OTHER PUBLICATIONS

Jan Holterman, Theo J.A. De Vries, "Active damping within an advanced microlithography system using piezoelectric Smart Discs," Mechatronics, Elsevier Ltd., No. 14, p. 15-34, (2003).
International Search Report dated Apr. 5, 2005.

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is disclosed. The apparatus includes an illumination system for providing a beam of radiation used to irradiate a patterning device, and a first support that supports the patterning device. The patterning device capable of patterning the beam of radiation. The apparatus also includes a second support that supports a substrate, a projection system for projecting the patterned beam of radiation onto a target portion of the substrate, and a projection system positioning module that controls at least one of a position and an orientation of the projection system based on at least one of a velocity and an acceleration of the projection system.

14 Claims, 5 Drawing Sheets

LITHOGRAPHIC APPARATUS AND DEVICE MANUFACTURING METHOD

BACKGROUND OF THE INVENTION

1. Field of the Invention

The present invention relates generally to the field of lithography. More specifically, the present invention relates to the mounting of a projection system of a lithographic projection apparatus.

2. Description of Related Art

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. When using extreme ultraviolet (EUV) radiation, only reflective masks are suitable, for reasons well known to a person skilled in the art. In the case of a mask, the support structure will generally be a mask table, which ensures that the mask can be held at a desired position in the incoming radiation beam, and that it can be moved relative to the beam if so desired;
- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described here above, the patterning devices can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning devices as here above set forth.

Lithographic projection apparatus can be used, for example, in the manufacture of integrated circuits (ICs). In such a case, the patterning devices may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure or a variant thereof, will have to be repeated for each new layer. Eventually, an array of devices will be present on the substrate (wafer). These devices are, then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The projection system as described above usually comprises one or more, for instance six, optical elements, such as lenses and/or mirrors. The optical elements direct the projection beam through the projection system and project it onto the target portion. In case the radiation system supplies a projection beam of EUV-radiation, mirrors should be used instead of lenses, in order to direct the projection beam, since lenses are not translucent to EUV-radiation.

When an extreme ultraviolet projection beam is used for projecting relatively small patterns, the demands for the projection system concerning the accuracy are rather high. For instance, a mirror, which is positioned with a tilting error of 1 nm, can result in a projection error of approximately 4 nm on the wafer.

A projection system for projecting an extreme ultraviolet projection beam comprises, for instance, 6 mirrors. Usually, one of the mirrors has a fixed spatial orientation, while the other five are mounted on e.g. Lorentz-force actuated mounts. These mounts can preferably adjust the orientation of the mirrors in 6 degrees of freedom (6-DoF-mounts) using 6 Lorentz-force motors per mirror. The projection system further comprises sensors for measuring the spatial orientation of the mirrors.

The projection system is mounted on a reference, or metrology frame, by means of, for example, compliant mounting devices. These mounting devices present low-pass characteristics, having a cut-off or Eigen frequency of, for example, about 30 Hz. This is done to stabilize the projection beam and isolate it from vibrations and disturbances coming from the environment, such as adjacent systems. The reference frame is, in turn, mounted on a so-called base frame through a very soft mount, in conventional lithographic apparatus called an 'air mount'. These mounts have low-pass characteristics and may have an Eigen frequency of approximately 0.5 Hz. Onto the reference frame, amongst others, an interferometer wafer stage position measurement system is mounted. The mirrors in the projection system need to be positioned very accurately with respect to each other, whereas the wafer stage and reticle stage need to be positioned very accurately with respect to this set of mirrors again.

Currently, positioning the mirrors relative to each other is being done by attaching one rigidly to a frame of the projection system, hereinafter called the projection optics box or POB. The other mirrors are actively positioned relative to the POB. Positioning accuracy depends, amongst other things, on the level of disturbance of the POB. Currently, the level of disturbance of the POB is too high to rigidly attach the POB to the reference frame. Possible causes for disturbance are:

Base frame motion; the reference frame is mounted on this base frame through springs which are very soft but still finite in stiffness. So, vibration of the base frame causes some force disturbance being introduced into the reference frame. This base frame, in turn, just stands on the floor, thus being subject to floor vibrations. Also, stage acceleration forces, left over after balancing, are being exerted onto this base frame, again causing vibration;

Air mount noise. They cause noise-like force disturbance exerted onto the reference frame;

Noise from water-cooling. It is expected that cooling of the reference frame is required or desired. This will be done by water-cooling. The flow of water through the pipes and tubes also causes force noise to be exerted onto the reference frame; and Internal dynamical modes of the reference frame or of other modules attached to the reference frame.

Because current positioning systems use passive elements, like soft mounts, for suppressing vibrations in the projection system, vibrations coming from a reference, or metrology frame still affect the projection system, mounted thereon.

BRIEF SUMMARY OF THE INVENTION

It is an aspect of embodiments of the present invention to provide a projection system that is less sensitive to vibrations and disturbances of its surroundings.

This and other aspects are achieved with embodiments of the present invention that relate to a lithographic projection apparatus comprising: an illumination system for providing a projection beam of radiation, a first support for supporting a mask, a second support for supporting a substrate, a projection system for imaging an irradiated portion of the mask onto a target portion of the substrate, and a positioning module for positioning the projection system.

In at least one embodiment, the lithographic projection apparatus is characterized in that the positioning module is arranged to actively control at least one of a position and orientation of the projection system. By actively controlling the position and/or orientation of the projection system, the projection system may be mounted on any arbitrary frame, and can even be mounted on a working floor. Furthermore, if the projection system is made free of vibrations, there is no need to adjust the position and/or orientation of individual projection devices like mirrors and lenses.

It is another aspect of embodiments of the present invention to provide a lithographic projection apparatus that includes an illumination system for providing a beam of radiation used to irradiate a patterning device, and a first support that supports the patterning device. The patterning device is capable of patterning the beam of radiation. The apparatus also includes a second support that supports a substrate, a projection system for projecting the patterned beam of radiation onto a target portion of the substrate, and a projection system positioning module that controls at least one of a position and an orientation of the projection system based on at least one of a velocity and an acceleration of the projection system.

It is a further aspect of embodiments of the present invention to provide a lithographic apparatus that includes an illumination system for providing a beam of radiation used to irradiate a patterning device, and a first support that supports the patterning device. The patterning device is capable of patterning the beam of radiation. The apparatus also includes a second support that supports a substrate, a projection system for projecting the patterned beam of radiation onto a target portion of the substrate, and a projection system positioning module that controls at least one of a position and an orientation of the projection system during projection of the patterned beam of radiation onto the target portion of the substrate.

It is another aspect of embodiments of the present invention to provide a device manufacturing method that includes providing a beam of radiation, patterning the beam of radiation, projecting the patterned beam of radiation onto a target portion of a layer of radiation-sensitive material, measuring at least one of a velocity and an acceleration of said projection system, and positioning said projection system by controlling at least one of a position and an orientation of said projection system, based on at least one of said velocity and acceleration.

In an embodiment, the apparatus comprises sensors to measure at least one of a velocity and acceleration of the projection system, and to output sensing signals indicative thereof, wherein the sensors use an inertia principle. Independent velocity and/or acceleration sensors, e.g. geophones and accelerometers can be mounted on just the projection system. Using such sensors will lead to an absolute and stationary positioning of the projection system which makes controlling the position of other components of the apparatus relative to the projection system easier.

In a further embodiment, the positioning module described above, comprises: interfaces arranged to adjust at least one of the position and orientation of the projection system in response to a drive control signal; a first controller responsive to the sensing signals for generating the drive control signal so as to correct for the velocity and/or acceleration of the projection system.

In yet another embodiment, the apparatus described above, further comprises a base frame, wherein the projection system is mounted on the base frame by means of interfaces. In this case, no reference frame vibrations need to be compensated.

Preferably, the projection system, described above, is mounted in 6 degrees of freedom, and the sensors are arranged to determine the velocity and/or acceleration of the projection system in 6 degrees of freedom.

In yet another aspect of the invention, the interfaces are arranged to adjust the position and/or orientation of the projection system in 6 degrees of freedom.

The invention further relates to a device manufacturing method as mentioned above, characterized by: measuring at least one of velocity and acceleration of the projection system, and positioning the projection system by actively controlling at least one of a position and orientation of the projection system.

In at least one embodiment, a dynamically mounting module is provided for the projection system in which Lorentz actuators are used to connect the projection system to its environment. The Lorentz actuators may be controlled by a controller using velocity and/or acceleration information from the projection system. So-called inertia sensors may be used, like geophones, to measure an "absolute velocity". In this way, the projection system may be controlled without any reference to its (possibly vibrating) environment.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
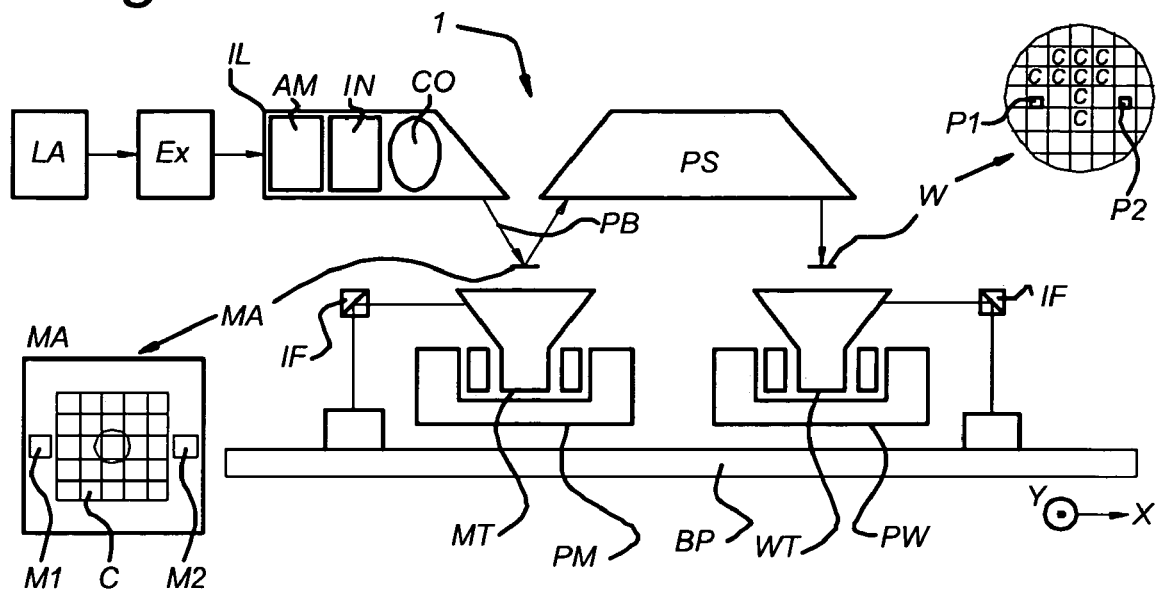
FIG. 1 is a schematic of a lithographic projection apparatus according to at least one embodiment of the invention.

FIG. 1 schematically depicts a lithographic projection apparatus 1 according to a particular embodiment of a lithographic projection apparatus. The apparatus includes a radiation system Ex, IL, for supplying a projection beam PB of radiation (e.g. EUV-radiation). In this particular case, the radiation system also includes a radiation source LA. The apparatus further includes a first support MT that supports a patterning device, and second support WT that supports a substrate. The first and second supports MT, WT should be construed broadly to includes any structure that supports any type of patterning device and substrate, respectively. For example, the first support may be a mask table that is provided with a mask holder for holding a mask MA (e.g. a reticle), and the second support may be a substrate table that is provided with a substrate holder for holding a substrate W (e.g. a resist coated silicon wafer). A projection system PS (e.g. mirror group) for imaging a patterned beam of radiation onto a target portion C (e.g. comprising one or more dies) of the substrate W is also provided. The mask table MT is connected to a first positioning device PM for accurately positioning the patterning device with respect to the projection system PS, and the substrate table WT is connected to a second positioning device PW for accurately positioning the substrate with respect to the projection system PS.

As here depicted, the apparatus is of a reflective type (i.e. has a reflective mask). However, in general, it may also be of a transmissive type, for example (with a transmissive mask). Alternatively, the apparatus may employ another kind of patterning device, such as a programmable mirror array of a type as referred to above.

The source LA (e.g. EUV-source) produces a beam of radiation. This beam is fed into an illumination system (illuminator) IL, either directly or after having traversed conditioning devices, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case When the source LA is an excimer laser.

The beam PB subsequently intercepts the mask MA, which is held on a mask table MT. Having been selectively reflected by the mask MA, the beam PB passes through the projection system PS, which focuses the beam PB onto a target portion C of the substrate W. With the aid of the second positioning device PW (and interferometric measuring means IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB; and
2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed $V=M v$, in which M is the magnification of the projection system PS (typically, $M=\frac{1}{4}$ or $\frac{1}{5}$). In this manner, a relatively large target portion C can be exposed, without having to compromise on resolution.

Figure 2:
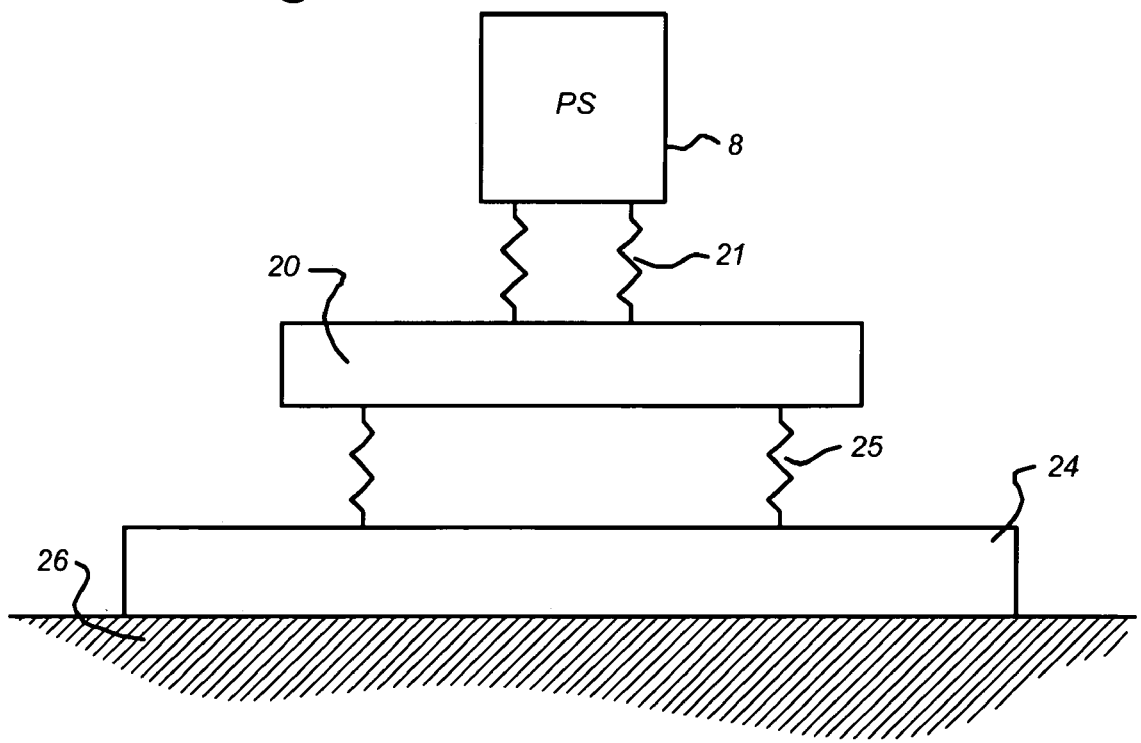
FIG. 2 is a schematic of a projection system mounted according to the prior art.

FIG. 2 depicts a known projection system PS, as already discussed above. The projection system PS comprises a Projection Optics Box (hereinafter referred to as POB) 8 including several mirrors, not shown. The projection system PS as a whole is mounted on a reference, or metrology frame 20 by so-called 'soft mounts', i.e. 30 Hz mounting devices 21. The reference frame 20 is supported by a base frame 24 via so-called 'air mounts' 25. These air mounts 25 comprise very soft suspension means. The frequency range of the air mounts 25 may, for example, be between about 0.5 and about 1.0 Hz. The base frame 24 is directly supported by a working floor 26. Under working conditions, even vibrations coming from the working floor 26 may disturb a fabrication process. This is why extremely soft air mounts should be used.

Figure 3:
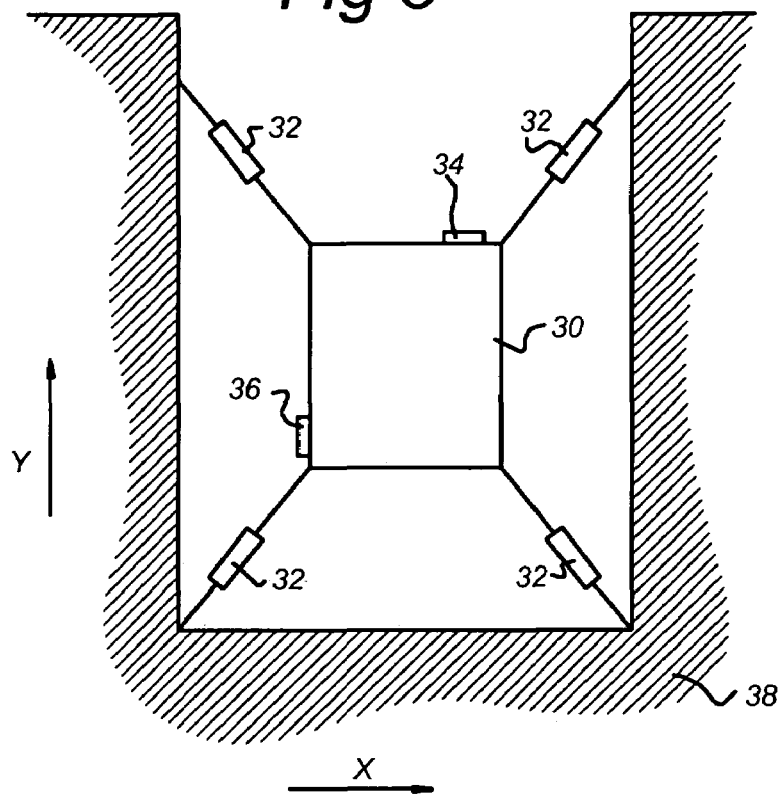
FIG. 3 is a schematic of a projection system of a lithographic projection apparatus mounted according to an embodiment of the invention.

FIG. 3 shows a POB 30 of a lithographic apparatus according to an embodiment of the invention. The POB 30 is supported by a base frame 38 by means of interfaces 32, such as, for example, Lorentz actuators. For the sake of simplicity FIG. 3 only shows the mounting and measure in two directions X and Y. However, it should be noted, that the POB 30 is also mounted in a Z-direction. On the POB 30, inertia sensors 34, 36 are situated to measure a velocity and/or acceleration of the POB 30.

According to an embodiment, the sensors 34, 36 are arranged to determine the velocity and/or acceleration of the POB 30. In a specific embodiment, the sensors 34, 36 are arranged to determine the velocity and/or acceleration in 6 degrees of freedom. The sensors 34, 36 may comprise geophones to measure the velocity and they may also comprise accelerometers (not shown) to measure the acceleration of the POB 30. The geophones 34, 36 each comprise a housing in which a coil is suspended from a spring in the center of a plurality of magnets. When the housing is moved, the mass of the coil tends to stay put (is inert), thereby inducing small currents in the coil as it moves through the magnetic field. In this way, the geophones 34, 36 measure velocity of motion of the POB 30. A geophone is particularly suitable for measuring the velocity of the POB 30, since the geophone does not need to be fixed to a (most likely disturbing) surrounding.

Because the velocity of the projection system is measured using the inertia principle, it appears as if an "absolute" velocity (i.e. a velocity with reference to the "sky") is measured. Feedback of this "absolute" velocity into the interfaces 32, e.g. Lorentz actuators, by way of a drive control signal, results in a "Skyhook damper". This principle is well known to a skilled person. Contrary to physical dampers, it seems that a skyhook damper is only attached, at one side, to the POB 30, and, at the other side, attached to an "absolute" and stationary reference, i.e. this "sky".

Figure 4A:
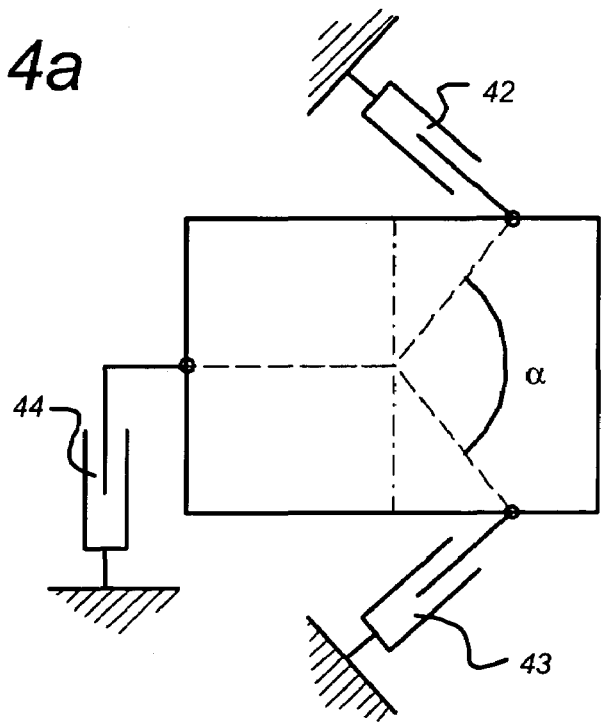
FIG. 4 is a schematic of a projection optics box of FIG. 3, positionable in 6degrees of freedom.
Figure 4B:
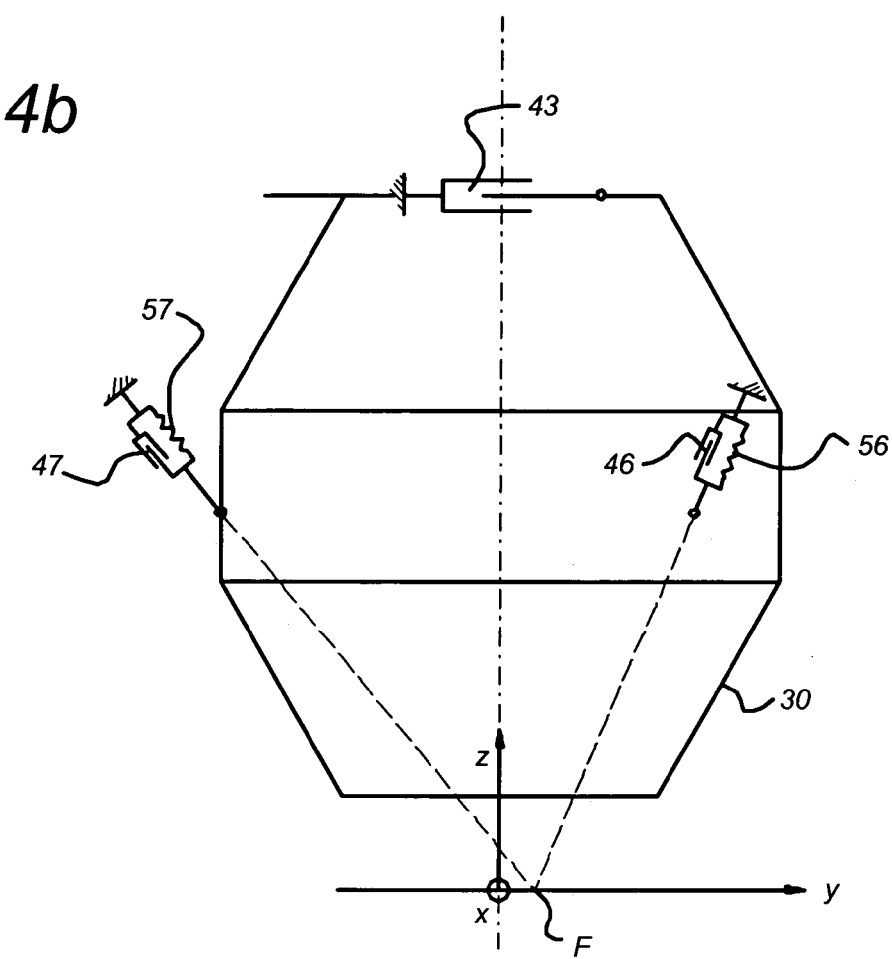
Figure 4C:
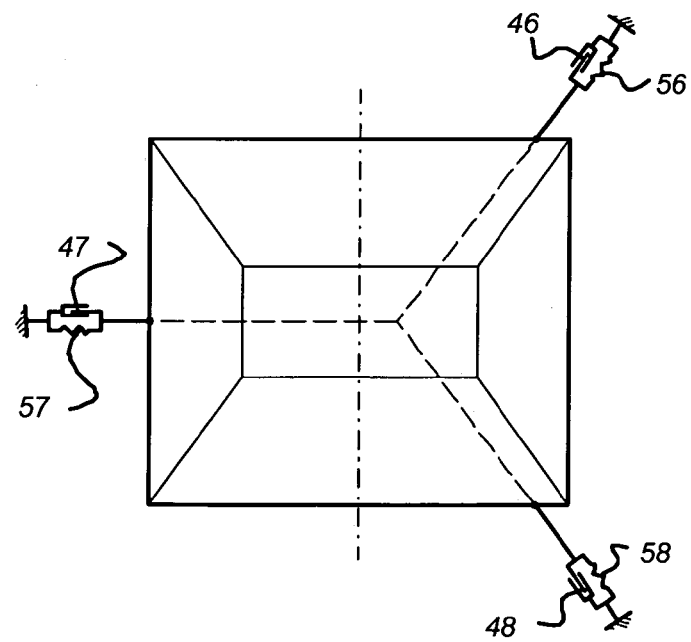

FIGS. 4a, 4b and 4c show different views of a POB 30 of a preferred embodiment of the invention. The POB 30 has a rectangular top surface and bottom surface. FIG. 4A shows a top view of the POB 30. FIG. 4b shows a side view of the POB 30. The POB 30 contains a mid part that is box shaped. To the top and to the bottom of the POB 30, the walls of the POB 30 converge slightly. At its top, the POB 30 is mounted by three Lorentz actuators 42, 43, 44, each of which are positioned in the plane of the top surface of the POB 30. The Lorentz actuators 42, 43, 44 are directed in three different directions. Preferably, an angle α between planes perpendicular to the actuator directions is about 120°.

In addition to the three actuators 42, 43, 44 on top of the POB 30, another three actuators 46, 47, 48 are connected to the POB 30. FIG. 4b shows a side view of the POB 30, in which two of the actuators, i.e. actuator 46 and 47 are visible. The actuators 46, 47, 48 are connected to connection points at the side walls of the POB 30. In order to compensate for the gravity, parallel to the actuators, three gravity compensators 56, 57, 58 are situated. The gravity compensators 56, 57, 58 may comprise very soft static springs. Alternatively, the compensators may be pneumatic or magnetic in nature. They compensate for the bulk of the gravity forces acting on the POB 30. By using extra gravity compensators, the Lorentz actuators 46, 47, 48 will be relieved so that less heat will be generated in the Lorentz actuators. FIG. 4*c* shows a bottom view of the POB 30. In this view, the Lorentz actuator 48 and the gravity compensator 58 are visible too.

Preferably, each of the three sets of interfaces 46, 56; 47, 57; 48, 58 attached to the bottom of the POB 30, is pointing at one and the same point F, as shown in FIG. 4*b*. The point F will correspond a focus point on a wafer on the second object table. Moreover, the three sets are evenly spaced as seen from the top in the direction of an optical axis corresponding to the direction of a radiation beam.

Figure 5:
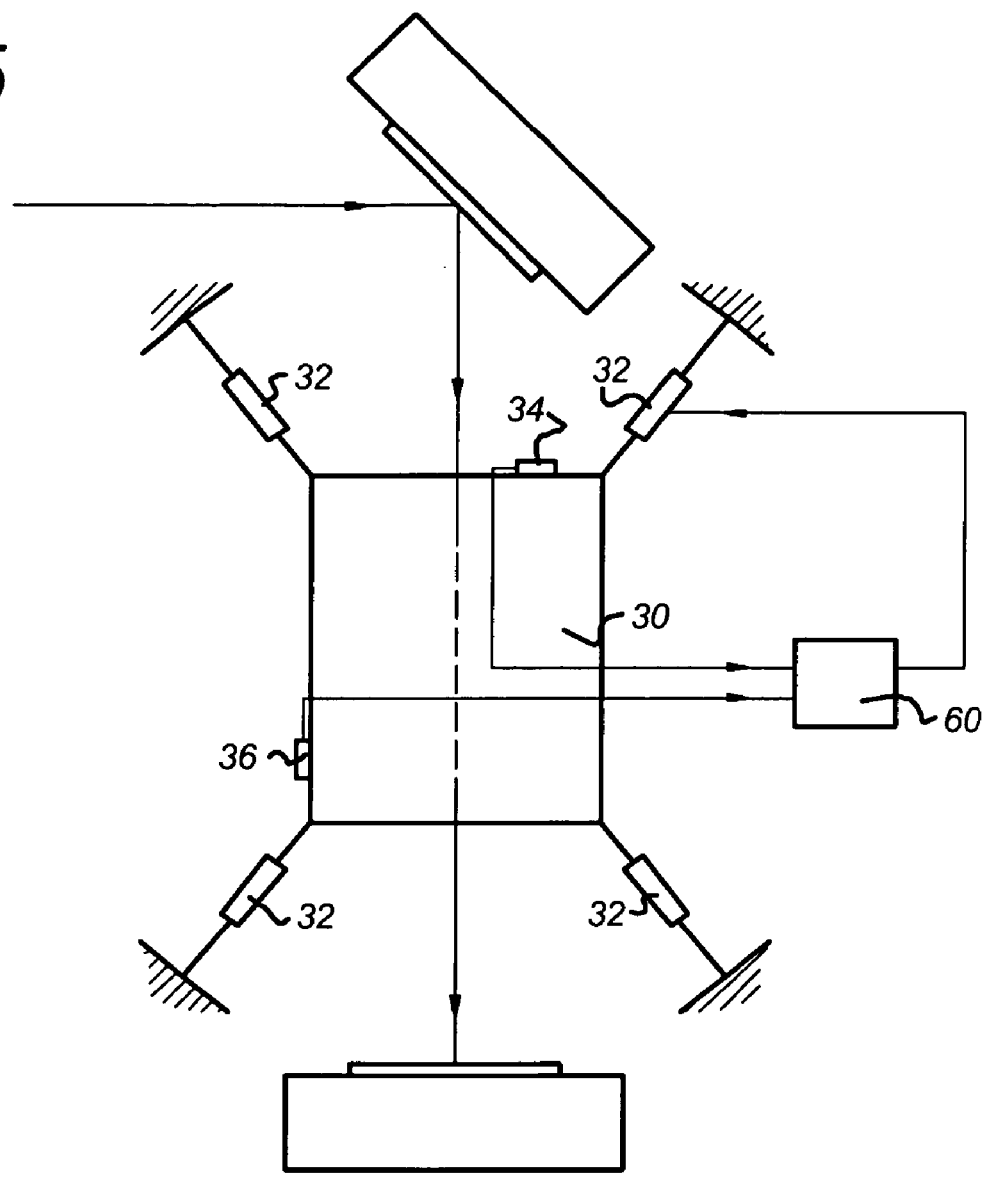
FIG. 5 is a schematic of another embodiment of the projection system of FIG. 3.

In an embodiment, the positioning module of the projection apparatus comprises a controller 60, as shown in FIG. 5, to generate a drive control signal so as to correct for the velocity and/or acceleration of the POB 30. FIG. 5 shows a POB 30, as was already shown in FIG. 3. The sensors 34 and 36 are arranged to output sensing signals. These sensing signals are input to the controller 60. The controller 60 is arranged to generate a drive control signal, which is sent to the interfaces 32. The sensors 34, 36 measure the velocity and/or acceleration of the POB 30. The controller 60 will use the sensing signals to determine the drive control signal. Preferably, the controller 60 receives sensing signals from all the sensors 34, 36 to determine drive signals for all the 6 degrees of freedom (DoF). The controller 60 can be arranged as a computer device in a way that will be clear to a person skilled in the art. The controller 60 can comprise a micro-processor arranged to communicate with a memory device and an I/O-device. The I/O-device is arranged to receive and transmit the signals mentioned above. The memory device comprises information about the ideal spatial orientation of the POB 30 and accordingly, the processing device can compute the deviation between the ideal and the actual spatial orientation of the projection devices 10 on successive points in time.

Figure 6:
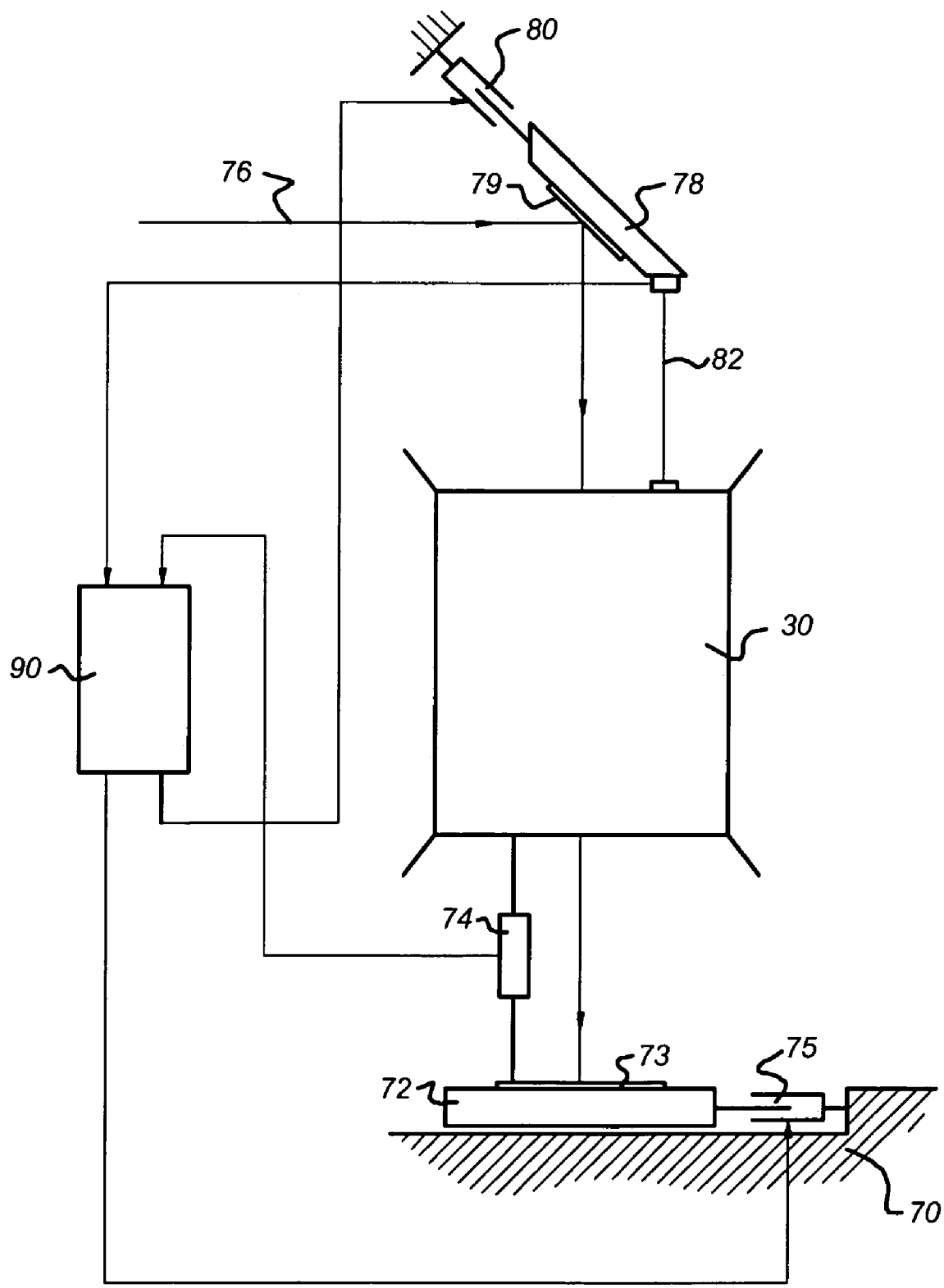
FIG. 6 is a schematic of a further embodiment of the projection system of FIG. 3.

FIG. 6 shows a further embodiment of the invention. Positioning of a mask table 78, holding a mask 79, and a wafer table 72, holding a wafer 73 (i.e. substrate), is done with drivers 80, 75, respectively. The drivers 75, 80 can be for example Lorentz motors. In order to accurately position the wafer table 73 and the mask table 78, a controller 90 is provided with information about the position of these tables 72, 78. Therefore, the positions of the tables 72, 78 are measured with support sensors 82, 74, respectively. In FIG. 6 the support sensors 82, 74 measure the position of the tables 72, 78 relative to the POB 30. The support sensors 80, 74 may comprise interferometers, which measure the position of the mask table 78 with reference to the top of the POB 30, and the position of the wafer table with reference to the bottom of the POB 30. Alternatively, additional sensors may be attached to the POB 30 that directly measure the mask table position.

Since the POB 30 is dynamically controlled to be absolute still, the adaptation of the tables 72, 78 relative to the POB 30 is simplified compared to the prior art.

Whilst specific embodiments of the invention have been described above, it will be appreciated that the invention may be practiced otherwise than as described. The description is not intended to limit the invention.

What is claimed is:

1. A lithographic projection apparatus comprising:
   an illumination system for providing a beam of radiation used to irradiate a patterning device;
   a first support that supports the patterning device, the patterning device capable of patterning the beam of radiation;
   a second support that supports a substrate;
   a projection system for projecting the patterned beam of radiation onto a target portion of the substrate; and
   a projection system positioning module that controls at least one of a position and an orientation of the projection system based on at least one of a velocity and an acceleration of the projection system.

2. The apparatus according to claim 1, further comprising sensors for measuring at least one of the velocity and the acceleration of the projection system, and for outputting sensing signals indicative thereof, wherein said sensors use an inertia principle.

3. The apparatus according to claim 2, wherein said sensors for measuring said velocity of said projection system comprise a geophone.

4. The apparatus according to claim 2, wherein said projection system positioning module comprises:
   interfaces for adjusting at least one of said position and said orientation of said projection system in response to a drive control signal; and
   a controller responsive to said sensing signals for generating said drive control signal so as to correct for said at least one of said velocity and said acceleration of said projection system.

5. The apparatus according to claim 4, further comprising a base frame, wherein said projection system is mounted on said base frame with said interfaces.

6. The apparatus according to claim 2, wherein said projection system is mounted in 6 degrees of freedom.

7. The apparatus according to claim 6, wherein said sensors are arranged to determine at least one of said velocity and said acceleration of said projection system in 6 degrees of freedom.

8. The apparatus according to claim 6, wherein said interfaces are arranged to adjust at least one of said position and said orientation of said projection system in 6 degrees of freedom.

9. The apparatus according to claim 4, wherein said interfaces comprise Lorentz actuators to function as spring-damper combinations.

10. The apparatus according to claim 4, wherein said interfaces comprise static springs to function as gravity compensators.

11. The apparatus according to claim 1, further comprising a support positioning module, wherein said support positioning module comprises:
   support sensors arranged to determine at least one of a position and an orientation of at least one of said first and said second supports, and to output support sensing signals indicative thereof;
   support drivers arranged to adjust at least one of said position and said orientation of at least one of said first and said second support, in response to a support drive signal;
   a controller responsive to said support sensing signals for generating said support drive signal so as to correct for at least one of said position and said orientation of at least one of said first and said second support.

12. The apparatus according to claim 11, wherein said support sensors are arranged to determine at least one of a position and an orientation of at least one of said first and said second support, relative to said projection system.

13. A device manufacturing method, comprising:
providing a beam of radiation;
patterning the beam of radiation;
projecting the patterned beam of radiation onto a target portion of a layer of radiation-sensitive material;
measuring at least one of a velocity and an acceleration of said projection system; and
positioning said projection system by controlling at least one of a position and an orientation of said projection system, based on at least one of said velocity and said acceleration.

14. The method according to claim 13, further comprising:
determining at least one of a position and an orientation of at least one of a first and second support relative to said projection system; and
adjusting at least one of said position and said orientation of at least one of said first and said second support, so that changes in at least one of said position and said orientation of at least one of said first and said second support relative to said projection system are minimized.

* * * * *